United States Patent [19]

Van Roessel

[11] 4,166,237
[45] Aug. 28, 1979

[54] HORIZONTAL DEFLECTION CIRCUIT FOR TELEVISION CAMERA

[75] Inventor: Frederik J. Van Roessel, Upper Saddle River, N.J.

[73] Assignee: North American Philips Corporation, New York, N.Y.

[21] Appl. No.: 624,121

[22] Filed: Oct. 20, 1975

[51] Int. Cl.$^2$ ............................................. H01J 29/56
[52] U.S. Cl. ..................................... 315/370; 315/403
[58] Field of Search ................ 315/403, 370, 371, 397

[56] References Cited

U.S. PATENT DOCUMENTS

| | | | |
|---|---|---|---|
| 3,192,433 | 6/1965 | Schneider | 315/370 LC |
| 3,426,241 | 2/1969 | Perkins | 315/307 LC |
| 3,434,002 | 4/1969 | Oliver | 315/403 |
| 3,439,221 | 4/1969 | Drummond | 315/370 |
| 3,646,393 | 2/1972 | Tarr | 315/403 |
| 3,740,611 | 6/1973 | Slavik | 315/371 |
| 3,769,542 | 10/1973 | Pieters | 315/403 |

FOREIGN PATENT DOCUMENTS

| | | |
|---|---|---|
| 934483 | 8/1963 | United Kingdom . |
| 935722 | 9/1963 | United Kingdom . |
| 1215201 | 12/1970 | United Kingdom . |
| 1251850 | 11/1971 | United Kingdom . |
| 1366392 | 9/1974 | United Kingdom . |
| 1449375 | 9/1976 | United Kingdom . |

Primary Examiner—Theodore M. Blum
Attorney, Agent, or Firm—Thomas A. Briody; William J. Streeter

[57] ABSTRACT

A deflection circuit has a switching transistor to switch current from a supply transistor through deflection coils. Both the base and collector current of the supply transistor are sensed to eliminate temperature variations in a linearity correction circuit. The deflection coils have series transformers coupled to them for individual linearity correction. This enables higher values of variable resistors to be used, thus eliminating contact potential problems.

7 Claims, 1 Drawing Figure

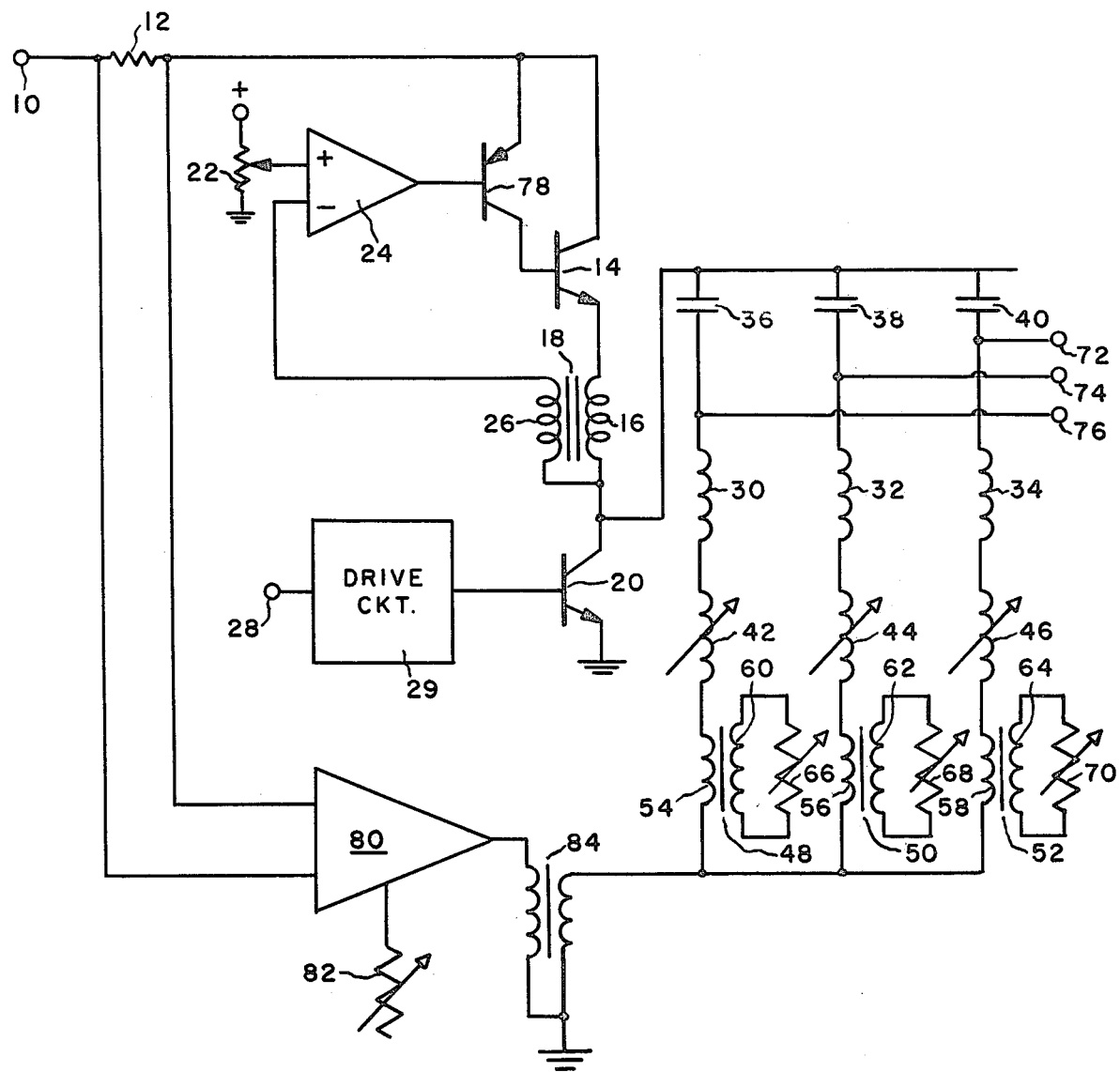

HORIZONTAL DEFLECTION CIRCUIT FOR TELEVISION CAMERA

The present invention relates to deflection circuits and more particularly to ones for cameras with linearity correction.

In such circuits it is typical that the collector current of a current supply transistor is used to generate a voltage that is applied to the deflection coils to correct for non-linearities that are present in the deflection current due to deflection coil resistance. However, the gain of the supply transistor varies with temperature, which causes variation in the collector current which has no relationship to the deflection current. This causes errors in the correction current. The master linearity correction circuit used a large amount of power in prior art circuits. Still further, linearity correction resistors are coupled in series with a deflection coil. Since these resistors must have a low value, their wiper arm contact resistance is significant and causes irregular operation.

It is therefore an object of the present invention to have a temperature stable linearity correction circuit.

It is another object to have one that utilizes a minimum of power.

It is yet another object to have one that minimizes the effects of wiper arm contact resistance.

In brief, these and other objects are achieved by having a circuit that samples both the collector and base current of a current supply transistor. Since their sum is always a constant, the circuit is thermally stable. The sampling is done by a low value resistor and the sampled voltage is amplified by a class-B amplifier to minimize power consumption. Transformers and high value variable resistors are used to eliminate contact resistance problems.

These and other objects, features, and advantages will become apparent from the following description when taken in conjunction with the drawing in which:

The sole FIGURE is a partly block and partly schematic drawing of the invention.

The FIGURE shows a terminal 10 that receives of voltage of about plus ten volts. D.C. current flows through a sense resistor 12 and then primarily through a supply transistor 14, primary 16 of transformer 18, and switching transistor 20. The D.C. voltage at the collector of transistor 20 is determined by the reference voltage adjustment potentiometer 22 of amplifier 24. The deflection current is determined by the said D.C. voltage and the inductance of the deflection coils 30, 32, and 34. The D.C. voltage at the collector of transistor 20, causes a sawtooth current to flow through primary 16. Amplifier 24 is a differential amplifier that compares the reference voltage to the voltage sensed by secondary 26 of transformer 18, which is the average voltage at the collector of transistor 20, and hence stabilized this voltage by controlling the conduction through transistors 14 and 78. Terminal 28 receives horizontal drive and blanking pulses. Drive circuit 29 strips off the horizontal drive pulses, shapes them, and uses them to drive transistor 20 on during the scan time. During the flyback time, transistor 20 is cut off. Blue, green, and red deflection coils, 30, 32, and 34 are mounted in deflection yokes (not shown) and are A.C. coupled to transistor 20 through capacitors 36, 38 and 40 respectively. They integrate the voltage at the emitter of transistor 14 to produce an approximately linear sawtooth deflection waveform. Coils 42, 44 and 46 are series coupled to coils 30, 32 and 34 respectively to control the sweep size. Terminals 72, 74 and 76 receive currents to control the centering of the deflection sweep.

It is desirable to have a variable resistors in series with the coils to be used to achieve individual linearity adjustment. However, the required resistance is so small that the varying wiper arm contact resistance causes erratic operation. In accordance with one aspect of the present invention, transformers 48, 50, and 52 having low impedance primaries 54, 56 and 58 and high impedance secondaries 60, 62 and 64 are used. This enables variable resistors 66, 68 and 70 to have a high value, typically above 100 ohms, since the transformers transform this to a value of about one ohm in their primaries. Contact resistance is similarly transformed to a totally negligible value.

Deflection coils 30, 32 and 34 have some resistance and therefore the deflection sweep current will not be totally linear. It is therefore necessary to apply a sawtooth shaped correction voltage in addition to the D.C. voltage at the collector of transistor 20. This sawtooth voltage is derived from the sawtooth current in the winding 16, since it is exactly portional to the main deflection current and it is highly linear due to the fact the losses in transformer 18 are compensated for by the feedback arising amplifier 24 and winding 26, in order to linearize the sweep. If a resistor were placed in series with the collector of transistor 14 to sample the current in winding 16, it would not sample all of the sawtooth current, since part of it flows in the base. This portion will vary with the current gain of the transistor 14, which in turn varies with temperature. To overcome this, transistor 78 has its emitter coupled to the collector of transistor 14, and its collector coupled to the base of transistor 14. Therefore, virtually all of the base current of transistor 14 flows through the collector and then the emitter of transistor 78, where it joins the collector current of transistor 14. The sensing resistor 12 therefore senses the entire sawtooth current, regardless of temperature, and it has a small value of about 16 ohms to prevent excessive losses. The voltage across it is applied to amplifier 80, which comprises a differential amplifier followed by a class B amplifier. Since class B amplifiers have a low quiescent current, losses are again minimized. Control 82 controls the gain, and thus it is a master linearity control. Th class B amplifier has emitter follower output, and thus a low output impedance. This is lowered still further by step down transformer 84, so that the deflection coils 30, 32, and 34 will not see any excessive resistance that would distort the linearity of the deflection current. Thus transformer 84 applies the linearity correction voltage to the deflection coils to achieve a linear sweep.

It will be appreciated that many other embodiments are possible without departing from the spirit and scope of the invention.

I claim:

1. A circuit for generating a deflection current in a deflection coil, said circuit comprising a current supply first transistor means adapted to be coupled to a first end of said coil and for providing for a sawtooth deflection current in said coil, said transistor having base and collector electrodes means adapted to be coupled to a second end of said coil for supplying a voltage thereto for correcting the linearity of said deflection current, and means coupled to said transistor and said correcting means for sensing the current in said base and said collector and for applying a voltage proportional to and derived from said sensed current to said correcting means; whereby the linearity correction is temperature stable.

2. A circuit as claimed in claim 1 wherein said sensing means comprises a second transistor having an emitter coupled to said first transistor collector and a collector coupled to said first transistor base, and a low value sense resistor coupled to said first transistor collector and said second transistor emitter.

3. A circuit as claimed in claim 1 wherein said correcting means comprises a class-B amplifier.

4. A circuit as claimed in claim 3 wherein said correctin means further comprises a transformer having a high impedance primary coupled to said amplifier and a lower impedance secondary adapted to be coupled to said second coil end.

5. A circuit as claimed in claim 1 further comprising said coil, a transformer having a low impedance primary series coupled to said coil and a higher impedance secondary, and a variable resistor coupled to said secondary.

6. A circuit for generating a linearity correction current in a deflection coil, said circuit comprising means for providing a deflection voltage to said coil, a low value resistor means for sensing a sawtooth current proportional to a resulting deflection current in said coil, and a class-B amplifier means separate from said deflection voltage providing means and adapted to be coupled to said coil and coupled to said resistor means for providing a linearity correction voltage to said coil; whereby said circuit uses a minimum of power.

7. A circuit as claimed in claim 6 further comprising a transformer having a high impedance primary coupled to said amplifier and a lower impedance secondary means adapted to be coupled to said coil.

* * * * *